US008400226B2

United States Patent
Chen et al.

(10) Patent No.: US 8,400,226 B2
(45) Date of Patent: Mar. 19, 2013

(54) OSCILLATION CIRCUIT AND ASSOCIATED METHOD

(75) Inventors: Yen-Chung Chen, Santa Clara, CA (US); Tsai-Ming Yang, Tainan (TW); Jen-Tai Hsu, Miaoli County (TW)

(73) Assignees: Global Unichip Corporation, Hsinchu (TW); Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/208,539

(22) Filed: Aug. 12, 2011

(65) Prior Publication Data

US 2013/0038399 A1 Feb. 14, 2013

(51) Int. Cl.
*H03B 5/12* (2006.01)

(52) U.S. Cl. ............ 331/117 FE; 331/36 C; 331/185

(58) Field of Classification Search .......... 331/36 C, 331/117 FE, 117 R, 167, 185
See application file for complete search history.

(56) References Cited

U.S. PATENT DOCUMENTS

| 6,621,365 | B1* | 9/2003 | Hallivuori et al. | 331/179 |
|---|---|---|---|---|
| 7,071,790 | B2* | 7/2006 | Darabi et al. | 331/175 |
| 7,196,592 | B2* | 3/2007 | Shi et al. | 331/117 FE |
| 7,928,806 | B2* | 4/2011 | Lee et al. | 331/17 |
| 2007/0247237 | A1* | 10/2007 | Mohammadi | 331/36 C |
| 2009/0039973 | A1* | 2/2009 | Kitayama et al. | 331/36 |

OTHER PUBLICATIONS

Berny et al., "A 1.8-GHz Lc Vco With 1.3-GHz Tuning Range and Digital Amplitude Calibration", Apr. 2005, vol. 40, pp. 909-917, IEEE Journal of Solid-State Circuits.
Behzad Razavi, "RF Microelectrosnics", 1998, Prentice Hall PTR.
Behzad Razavi, "Devices and Circuits for Phase-Locked Systems", Feb. 2003, Wiley-IEEE Press.
Cao et al., "A 500mW Digitally Calibrated AFE in 65nm CMOS for 10Gb/s Serial Links over Backplane and Multimode Fiber", 2009, IEEE International Solid-State Circuits Conference.

* cited by examiner

*Primary Examiner* — Levi Gannon
(74) *Attorney, Agent, or Firm* — WPAT PC; Justin King

(57) ABSTRACT

An oscillation circuit and associated method, wherein the oscillation circuit provides a pair of oscillation signals at two oscillation nodes, and includes a first capacitor, a switch circuit and a second capacitor serially coupled between the two oscillation nodes; the switch circuit conducts between the first capacitor and the second capacitor on an enable voltage higher than a power voltage of the oscillation circuit.

7 Claims, 3 Drawing Sheets

US 8,400,226 B2

OSCILLATION CIRCUIT AND ASSOCIATED METHOD

FIELD OF THE INVENTION

The present invention relates to an oscillation circuit and associated method, and more particularly, to oscillation circuit and associated method providing improved quality factor and expanded oscillation frequency range with capacitors and a switch circuit, which is enabled by over-drive voltage, serially coupled between a differential pair of oscillation nodes.

BACKGROUND OF THE INVENTION

Oscillation circuits which provide periodically oscillating signals or clocks are essential building blocks of communication systems.

Please refer to FIG. 1 illustrating a multi-band differential oscillation circuit 10 according to a prior art. The oscillation circuit 10 has two nodes ns1 and ns2 as two oscillation nodes which output a differential pair of oscillation signals. The oscillation circuit 10 operates between a power voltage VDD and a ground voltage VSS, and includes two transistors M1 and M2, inductors L1 and L2, capacitors CV1 and CV2, as well as K capacitor switch units Bp(1) to Bp(K). The transistors M1 and M2 form a feedback amplifier; the inductors L1 and L2, the capacitors CV1 and CV2 and the capacitor switch units Bp(1) to Bp(K) form an LC (inductance-capacitance) loading of the amplifier. The capacitors CV1 and CV2 are variable capacitors with their capacitance controlled by an adjusting signal Sfc. The k-th capacitor switch unit Bp(k) of the capacitor switch units Bp(1) to Bp(K) includes a pair of capacitor C1($k$) and C2($k$), and a pair of transistors T1($k$) and T2($k$) as switches. The capacitor C1($k$) and the transistor T1($k$) are coupled between the nodes ns1, n1($k$) and the ground voltage VSS; the capacitor C2($k$) and the transistor T2($k$) are coupled between the nodes ns2, n2($k$) and the ground voltage VSS; and gates of the transistors T1($k$) and T2($k$) are controlled by a corresponding control signal Sp(k).

For the oscillation signals provided by the oscillation circuit 10, the oscillation frequency depends on a product of total inductance and total capacitance L_total*C_total; the oscillation frequency is calculated by: $1/(2*pi*sqrt(L\_total*C\_total))$, where pi is the constant ratio between circle's circumference to diameter. The total inductance L_total is dominated by inductance of the inductors L1 and L2, and the total capacitance C_total depends on capacitance of the capacitors CV1 and CV2, as well as capacitance provided by the capacitor switch units Bp(1) to Bp(K). When the control signal Sp(k) equals the power voltage VDD to turn on the transistors T1($k$) and T2($k$), the capacitors C1($k$) and C2($k$) respectively provide capacitance to the nodes ns1 and ns2, thus the total capacitance C_total increases; on the contrary, when the control signal Sp(k) equals the ground voltage VSS to turn off the transistors T1($k$) and T2($k$), only the parasitic components of capacitors C1($k$) and C2($k$) contribute to the total capacitance C_total.

When the control signals Sp(1) to Sp(K) of the capacitor switch units Bp(1) to Bp(K) remain fixed, the oscillation frequency of the oscillation circuit 10 changes along a band, such as a band BF(j) shown in FIG. 1, following change of the analog adjusting signal Sfc. By changing the digital control signal Sp(k) corresponding to the capacitor switch unit Bp(k), the oscillation frequency provided by the oscillation circuit 10 switches to different bands BF(0), BF(1), . . . , BF(j) to BF(J). For example, if all the control signals Sp(1) to Sp(K) equal the ground voltage VSS, the oscillation frequency of the oscillation circuit 10 varies along the band BF(0) following tuning of the adjusting signal Sfc. If a given control signal Sp(k) conducts its corresponding capacitor switch unit Bp(k) to contribute capacitance, the oscillation frequency varies along the band BF(1) of lower frequency, etc. The frequencies covered by the bands BF(0) to BF(J) span the oscillation frequency range of the oscillation circuit 10.

To evaluate performance of an oscillation circuit, the quality factor Q is an important performance reference. For an oscillation circuit with higher Q, its oscillation frequency converges with narrower dispersion bandwidth, and consumes less power. The quality factor Q is limited by equivalent resistance serially coupled to capacitance (in addition to equivalent resistance serially coupled to the inductance); the higher the resistance is, the lower the quality factor Q becomes. In the oscillation circuit 10 of prior art, when the transistors T1($k$) and T2($k$) conduct so the capacitors C1($k$) and C2($k$) contribute capacitance, source-drain turn-on resistance of the transistors T1($k$) and T2($k$) will be serially coupled to the capacitors C1($k$) and C2($k$) respectively at the nodes n1($k$) and n2($k$), and thus the quality factor of the oscillation circuit 10 is lowered.

To improve Q of the oscillation circuit 10, the transistors T1($k$) and T2($k$) in the capacitor switch unit Bp(k) must be implemented by transistors of larger (wider) sizes to reduce turn-on resistance of the transistors T1($k$) and T2($k$). However, larger transistors T1($k$) and T2($k$) suffer form greater parasitic capacitance which affects the total capacitance C_total of the oscillation circuit 10, so the oscillation frequency range of the oscillation circuit 10 is limited, and the oscillation frequency range can not be effectively increased. If smaller transistors T1($k$) and T2($k$) are adopted, not only the quality factor Q degrades, but also the phase noise of the oscillation circuit 10 raises to cause severe oscillation jitter.

SUMMARY OF THE INVENTION

Therefore, the present invention provides an oscillation circuit and associated method to address issues of prior art.

An objective of the invention is to provide an oscillation circuit operating between a ground voltage and a power voltage, and providing a pair of oscillating signals respectively at a first oscillation node and a second oscillation node. The oscillation circuit includes one or multiple capacitor switch units, each capacitor switch unit includes a first capacitor, a second capacitor and a switch circuit. The first capacitor is coupled between the first oscillation node and a first node; the second capacitor is coupled between the second oscillation node and a second node. The switch circuit has two connection nodes and a control node; the two connection nodes are respectively coupled to the first node and the second node, the switch circuit receives an enable voltage at the control node and conducts between the two connection nodes on the enable voltage, wherein the enable voltage is greater than the power voltage. The switch circuit receives a disable voltage at the control node to stop conduction between the two connection nodes; the disable voltage can equal the ground voltage.

In an embodiment, each capacitor switch unit corresponds to a level shifter which provides the enable voltage to the switch circuit of the capacitor switch unit. The level shifter has an input node and an output node, the output node is coupled to the control node of the switch circuit. The level shifter receives a control signal at the input node and provides a corresponding switch signal at the output node, wherein a voltage range of the control signal is from the ground voltage to the power voltage, and a voltage range of the switch signal is from the ground voltage to the enable voltage.

In an embodiment, the switch circuit of each capacitor switch unit includes a switch transistor having a gate, a source and a drain respectively coupled to the control node and the two connection nodes of the switch circuit.

In an embodiment, each capacitor switch unit further includes a discharge circuit coupled to the two connection nodes and the ground voltage. When the switch circuit conducts between the two connection nodes, the discharge circuit conducts the two connection nodes to the ground voltage. On the other hand, when the switch circuit stops conduction between the two connection nodes, the discharge circuit stops conducting the two connection nodes to the ground voltage. In an embodiment, the discharge circuit includes a first grounding transistor, a second grounding transistor, a first resistor and a second resistor. Referring the two connection nodes of the switch circuit as a first connection node and a second connection node, the first ground transistor is coupled between the first connection node and a third node, and the second grounding transistor is coupled between the second connection node and a fourth node. The first resistor is coupled between the third node and the ground voltage, and the second resistor is coupled between the fourth node and the ground voltage.

Another objective of the invention is to provide a method applied to an oscillation circuit which operates between a power voltage and a ground voltage, provides an oscillation signal at an oscillation node, and includes a switch transistor and a capacitor serially coupled to the oscillation node. The method includes: providing an enable voltage which is greater than the power voltage, and conducting (turning on) the switch transistor with the enable voltage.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 2:
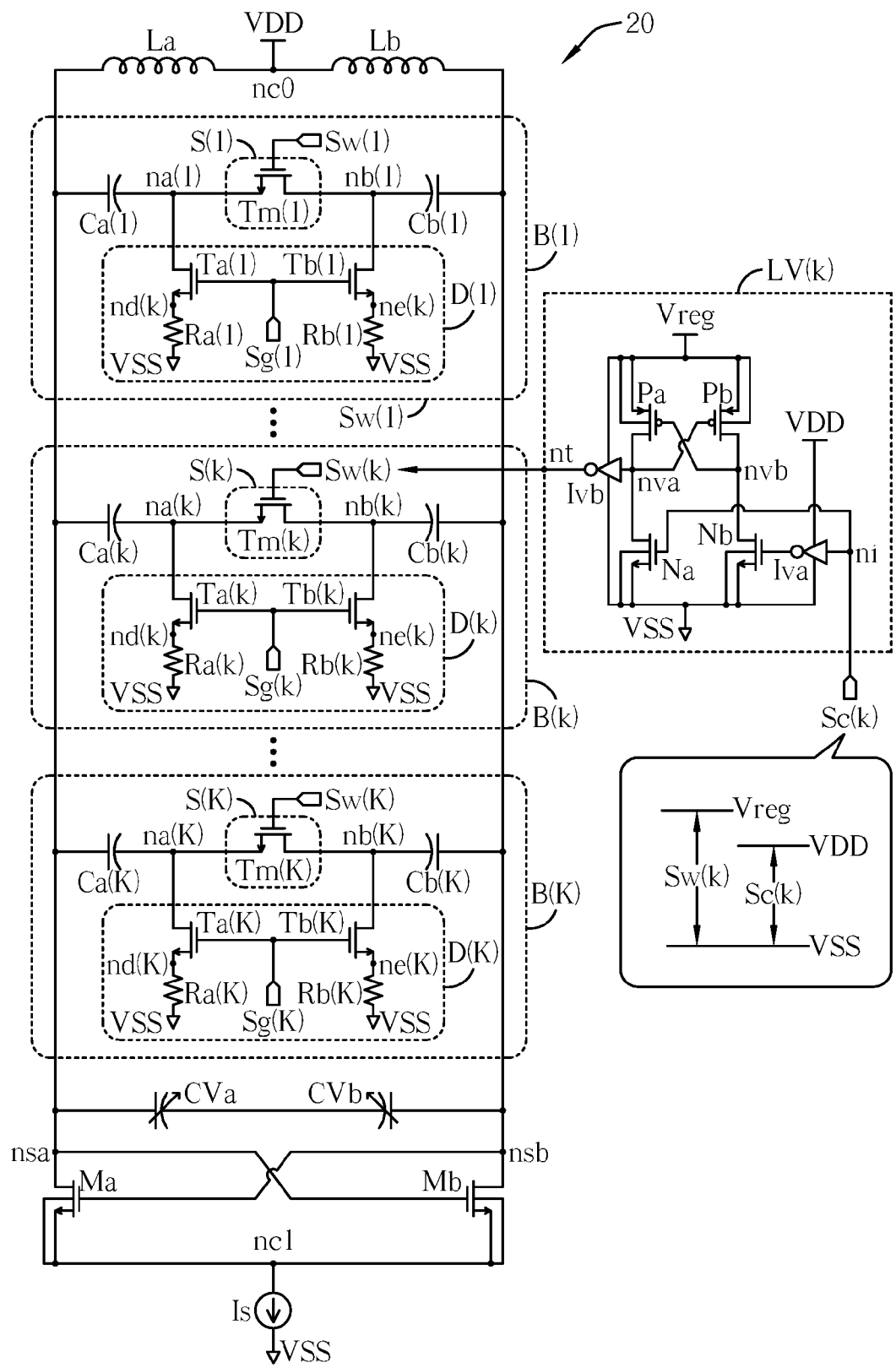
FIG. 2 illustrates an oscillation circuit according to an embodiment of the invention.

Please refer to FIG. 2 illustrating an oscillation circuit 20 according to an embodiment of the invention. The oscillation circuit 20 operates between a power voltage VDD and a ground voltage VSS, and includes two transistors Ma and Mb, a current source Is, two inductors La and Lb, two capacitors CVa and CVb, and a quantity K of capacitor switch unit(s) B(1) to B(K) with K equal to or greater than 1. Two nodes nsa and nsb, as two oscillation nodes, output a pair of differential oscillation signals. The oscillation circuit 20 is an LC oscillation circuit; comparing to oscillation circuits of other architectures (such as ring oscillators), the LC oscillation circuit has lower phase noise under given oscillation frequency and power consumption, also provides oscillation signals of larger voltage swing and frequency beyond limitation imposed by manufacture process.

In the oscillation circuit 20, the transistors Ma and Mb can be a pair of mutually matched n-channel MOS (Metal-Oxide-Semiconductor) transistors; sources and bulks of the transistors of the transistors Ma and Mb are coupled to a terminal of the current source Is, with another terminal of the current source Is coupled to the ground voltage Vss. Drains of the transistors Ma and Mb are respectively coupled to the nodes nsb and nsa to form a feedback amplifier. The inductors La and Lb, the capacitors CVa and CVb, as well as the capacitor switch units B(1) to B(K) provide LC loading. The inductor La is coupled between the nodes nc0 and nsa, and the inductor Lb is coupled between the nodes nc0 and nsb. The capacitors CVa and CVb can be a pair of matched variable capacitors serially coupled between the nodes nsa and nsb.

The k-th capacitor switch unit B(k) of the capacitor switch units B(1) to B(K) includes a pair of capacitors Ca(k) and Cb(k), a switch circuit S(k) and a discharge circuit D(k). The capacitors Ca(k) and Cb(k) can be a pair of mutually matched capacitors with equal capacitance; the capacitor Ca(k) is coupled between the nodes nsa and na(k), and the capacitor Cb(k) is coupled between the nodes nsb and nb(k). The switch circuit S(k) includes a transistor Tm(k) as a switch transistor; the transistor Tm(k) can be an n-channel MOS transistor, its drain and source, as two connection nodes, are respectively coupled between the nodes na(k) and nb(k); and its gate, as a control node, is coupled to a switch signal Sw(k). When the switch signal Sw(k) turns on the transistor Tm(k) to conduct between the nodes na(k) and nb(k), the nodes na(k) and nb(k) are virtually coupled to the ground voltage VSS, such that the capacitors Ca(k) and Cb(k) between the node nsa and nsb contribute capacitance to the total capacitance of the oscillation circuit 20. On the contrary, when the switch signal Sw(k) turns off the transistor Tm(k), the nodes na(k) and nb(k) are left floating, and the capacitors Ca(k) and Cb(k) of the capacitor switch unit B(k) do not contribute to the total capacitance. Selectively turning on and off each of the capacitor switch units B(1) to B(K), the oscillation circuit 20 provides oscillation frequency of multiple bands. For different capacitor switch units B(k1) and B(k2) (k1 not equal to k2), capacitance of the capacitors Ca(k1) and Ca(k2) can be the same or different.

To reduce source-drain turn-on resistance of the transistor Tm(k) for higher quality factor Q of the oscillation circuit 20, the transistor Tm(k) is driven to turn on by over-drive voltage. In the oscillation circuit 20, each capacitor switch unit B(k) is driven by a level shifter LV(k) (k=1 to K). The level shifter LV(k) operates between a dc voltage Vreg and the ground voltage VSS, receives a corresponding control signal Sc(k) at a node ni (as an input node) and provides the switch signal Sw(k) to the switch circuit S(k) at a node nt (as an output node). The control signal Sc(k) is a signal of digital nature with a voltage range from the ground voltage VSS to the power voltage VDD; and the voltage Vreg is the over-drive voltage which is greater (higher) than the power voltage VDD. According to the control signal Sc(k), the level shifter LV(k) works to provide the synchronized switch signal Sw(k) with extended voltage range from the ground voltage VSS to the voltage Vreg.

As the level shifter LV(k) works, when voltage of the control signal Sc(k) equals the power voltage VDD, voltage of the switch signal Sw(k) equals the voltage Vreg (an enable voltage) to turn on (enable) the transistor Tm(k); because the voltage Vreg is greater than the power voltage VDD, conduction of the transistor Tm(k) is enhanced to reduce its turn-on resistance. When the control signal transits to the ground voltage VSS (a disable voltage), the switch signal Sw(k) also equals the ground voltage VSS, so the transistor Tm(k) is turned off.

FIG. 2 also illustrates an embodiment of the level shifter LV(k). The level shifter LV(k) can include two inverters Iva, Ivb and transistors Pa, Pb, Na and Nb. The inverter Iva operates between the power voltage VDD and the ground voltage VSS, is coupled to the control signal Sc(k) at the node ni and outputs an inverted signal to gate of the transistor Nb. The transistors Pa and Pb can be matched p-channel MOS transistors with sources and bulks coupled to the voltage Vreg, gates respectively coupled to the nodes nvb and nva, and drains respectively coupled to the nodes nva and nvb. The transistors Na and Nb can be matched n-channel MOS transistors with sources and bulks coupled to the ground voltage VSS, drains respectively coupled to the nodes nva and nvb. Gate of the transistor Na is coupled to the control signal Sc(k) at the node ni. The inverter Ivb operates between the voltage Vreg and the ground voltage VSS, inverting signal of the node nva to generate the switch signal Sw(k) of the node nt. The voltage Vreg can be provided by a regulator or a charge pump (not shown).

In the capacitor switch unit B(k), the discharge circuit D(k) works in coordinate with the switch circuit S(k). When the control signal Sw(k) enables the switch circuit S(k) by turning on the transistor Tm(k) with over-drive voltage, the discharge circuit D(k) provides resistive conduction paths coupled to the ground voltage VSS for the nodes na(k) and nb(k). The resistive conduction paths discharge the charges accumulated at the nodes na(k) and nb(k) to the ground voltage VSS, so voltages of the nodes na(k) and nb(k) are drawn to the ground voltage VSS, and virtual grounding of the switch circuit S(k) is enhanced; also, gate-source cross voltage and gate-drain cross voltage of the transistor Tm(k) are therefore expanded to increase conduction of the transistor Tm(k) and to further reduce turn-on resistance of the transistor Tm(k). On the other hand, when the switch circuit S(k) stops conduction, the discharge circuit D(k) stops conducting the resistive conduction paths, so the nodes na(k) and nb(k) are left floating.

FIG. 2 also illustrates an embodiment of the discharge circuit D(k). The discharge circuit D(k) includes two transistors Ta(k), Tb(k) and two resistors Ra(k), Rb(k). The transistors Ta(k) and Tb(k), as two grounding transistors, can be two matched n-channel MOS transistors with gates commonly coupled to a discharge signal Sg(k); drain and source of the transistor Ta(k) are respectively coupled to the nodes na(k) and nd(k), and drain and source of the transistor Tb(k) are respectively coupled to the nodes nb(k) and ne(k). The resistors Ra(k) and Rb(k) can be a pair of matched resistors, the resistor Ra(k) is coupled between the node nd(k) and the ground voltage VSS, the resistor Rb(k) is coupled between the node ne(k) and the ground voltage VSS. The discharge signal Sg(k) can be the control signal Sc(k), or a signal synchronized (in-phase) with the control signal Sc(k) or the switch signal Sw(k). The resistors Ra(k) and Rb(k) can be resistors of high resistance (e.g., in kilohms) and compact sizes. In another embodiment of the discharge circuit D(k), the resistors Ra(k) and Rb(k) can be removed, and sources of the transistors Ta(k) and Tb(k) are directly coupled to the ground voltage VSS.

Figure 1:
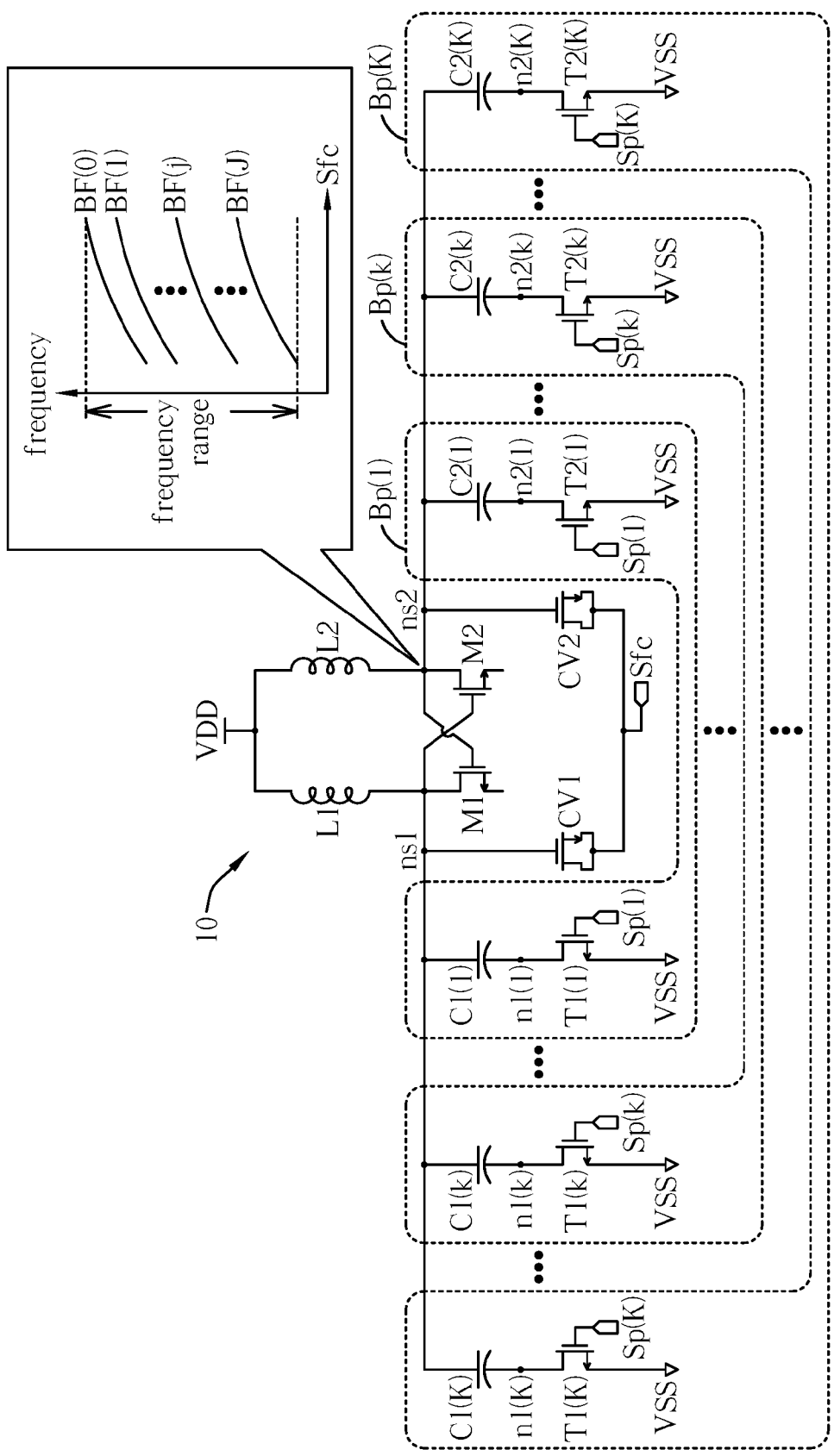
FIG. 1 (Prior art) illustrates a prior art oscillation circuit.
Figure 3:
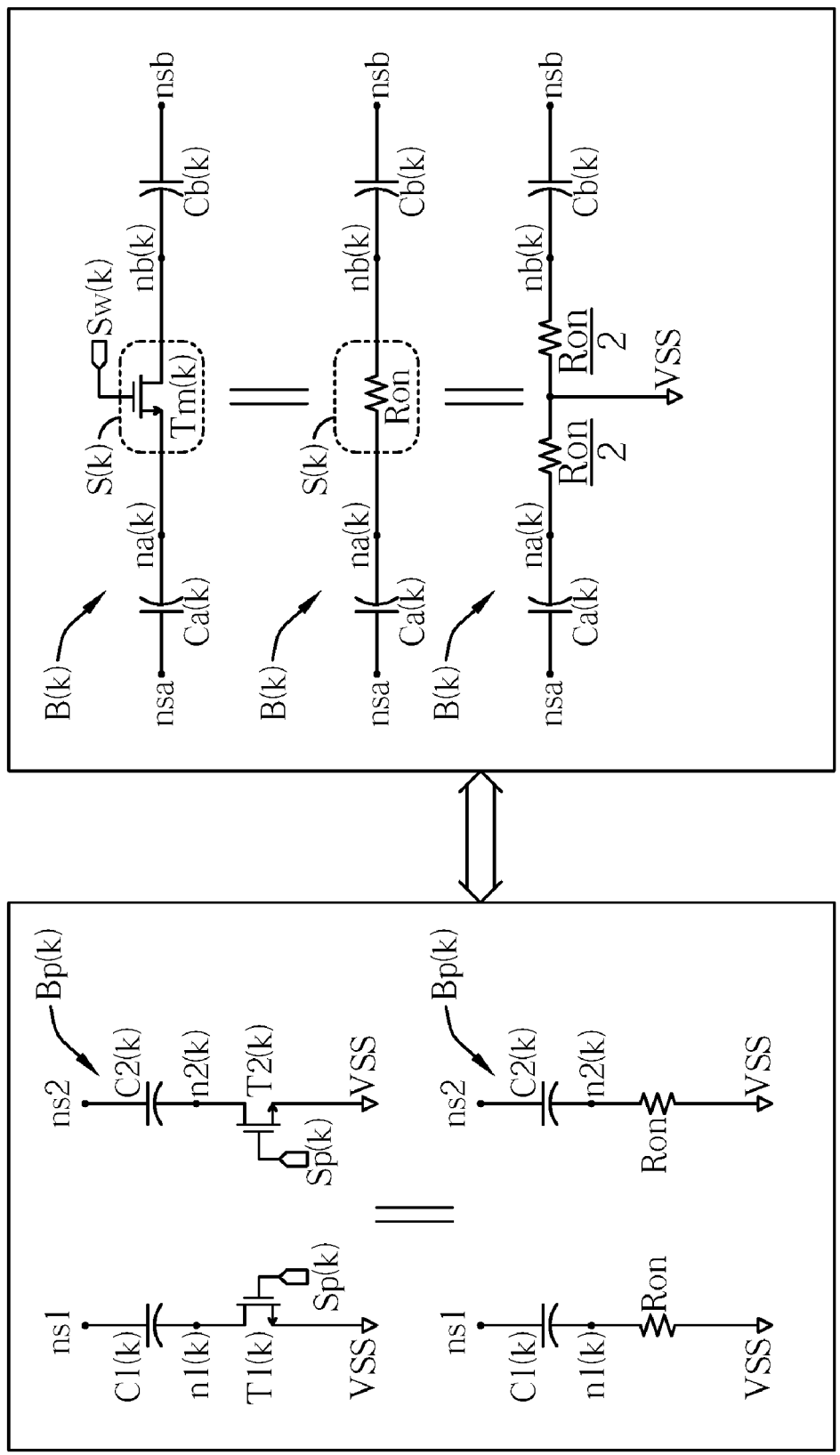
FIG. 3 compares the capacitor switch units of FIG. 1 and FIG. 2.

Comparing to the capacitor switch unit Bp(k) in the prior art oscillation circuit 10 of FIG. 1, in the capacitor switch unit B(k) of the disclosed oscillation circuit 20, the capacitor Ca(k), the switch circuit S(k) and the capacitor Cb(k) are serially coupled between the nodes nsa and nsb; with such circuit architecture, impact of the turn-on resistance of the transistor Tm(k) can be reduced. Please refer to FIG. 3 comparing the prior art capacitor switch unit Bp(k) of FIG. 1 and the capacitor switch unit B(k) of FIG. 2. For the capacitor switch unit Bp(k), when the transistors T1(k) and T2(k) are turned on to conduct, each of the capacitors C1(k) and C2(k) is serially coupled to a turn-on resistance Ron. On the other hand, for the capacitor switch unit B(k) of the invention, when the transistor Tm(k) conducts for virtual ground, the turn-on resistance Ron of the transistor Tm(k) is equivalently averaged to the capacitors Ca(k) and Cb(k), so each of the capacitors Ca(k) and Cb(k) is serially coupled to only half of the turn-on resistance Ron/2. Therefore, in the capacitor switch unit B(k) of the invention, the serial architecture of the capacitor Ca(k), the transistor Tm(k) and the capacitor Cb(k) is beneficial for high quality factor Q.

Moreover, because the over-drive enable voltage Vreg which is greater than the power voltage VDD is adopted to turn on the transistor Tm(k) of the capacitor switch unit B(k), turn-on resistance of the transistor Tm(k) is further limited to provide further benefit for the oscillation circuit 20 of the invention to achieve high Q. Since impact due to turn-on resistance of the transistor Tm(k) can be controlled without compromising a high quality factor Q, layout dimensions (sizes) of the transistor Tm(k) can be reduced as much as possible to decrease parasitic capacitance of the transistor Tm(k), thus the oscillation frequency range of the oscillation circuit 20 can be extended to provide higher (greater) oscillation frequency. Because the transistor Tm(k) of smaller sizes can tolerate higher over-drive voltage (smaller transistors have higher gate break-down voltage), while reducing sizes of the transistor Tm(k) to lower its parasitic capacitance, its turn-on resistance can be further reduced by higher over-drive voltage. As a result, the invention not only achieves high quality factor Q, but also effectively extends oscillation frequency range.

In addition, in the capacitor switch unit B(k) of the oscillation circuit 20, the resistors Ra(k) and Rb(k) of high resistance in the discharge circuit D(k) form a low-pass filter, so noise coupled from substrate to the LC loading can be suppressed and filtered by the low-pass filter.

To sum up, comparing to the prior art, the invention achieves high quality factor Q, low phase noise and low jitter, as well as extended oscillation frequency range, also isolates noise coupled from substrate. The oscillation circuit of the invention can be applied to clock generation, synthesis and phase-locking, etc.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An oscillation circuit operating between a ground voltage and a power voltage, and providing a pair of oscillating signals respectively at a first oscillation node and a second oscillation node; the oscillation circuit comprising:

a first capacitor coupled between the first oscillation node and a first node;

a second capacitor coupled between the second oscillation node and a second node;

a switch circuit having two connection nodes and a control node, the two connection nodes respectively coupled to the first oscillation node and the second oscillation node, the switch circuit receiving an enable voltage at the control node and conducting between the two connection nodes on the enable voltage, wherein the enable voltage is greater than the power voltage; and a level shifter having an input node and an output node, the output node coupled to the control node; the level shifter receiving a control signal at the input node and providing a corresponding switch signal at the output node, wherein a voltage range of the control signal is from the ground voltage to the power voltage, and a voltage range of the switch signal is from the ground voltage to the enable voltage.

2. The oscillation circuit as claimed in claim 1, wherein the switch circuit comprises:

a switch transistor having a gate, a source and a drain respectively coupled to the control node and the two connection nodes.

3. The oscillation circuit as claimed in claim 1 further comprising:

a discharge circuit coupled to the two connection nodes and the ground voltage; wherein when the switch circuit conducts between the two connection nodes, the discharge circuit conducts the two connection nodes to the ground voltage.

4. The oscillation circuit as claimed in claim 3, wherein when the switch circuit stops conduction between the two connection nodes, the discharge circuit stops conducting the two connection nodes to the ground voltage.

5. The oscillation circuit as claimed in claim 3, wherein the two connection nodes are respectively a first connection node and a second connection node, and the discharge circuit comprises:

a first grounding transistor coupled between the first connection node and a third node;

a second grounding transistor coupled between the second connection node and a fourth node;

a first resistor coupled between the third node and the ground voltage; and a second resistor coupled between the fourth node and the ground voltage.

6. The oscillation circuit as claimed in claim 1, wherein the switch circuit receives a disable voltage at the control node to stop conduction between the two connection nodes.

7. A method applied to an oscillation circuit; the oscillation circuit operating between a power voltage and a ground voltage, providing an oscillation signal at an oscillation node, and comprising a switch transistor and a capacitor serially coupled to the oscillation node; and the method comprising:

providing an enable voltage which is greater than the power voltage; and by a level shifter, selectively conducting the switch transistor with a switch signal, wherein the level shifter receives a control signal and provides the switch signal in response; a voltage range of the control signal is from the ground voltage to the power voltage, and a voltage range of the switch signal is from the ground voltage to the enable voltage.

* * * * *